United States Patent
Li et al.

(10) Patent No.: US 12,176,905 B2
(45) Date of Patent: Dec. 24, 2024

(54) PIPELINE CLOCK DRIVING CIRCUIT, COMPUTING CHIP, HASHBOARD AND COMPUTING DEVICE

(71) Applicant: SHENZHEN MICROBT ELECTRONICS TECHNOLOGY CO., LTD., Guangdong (CN)

(72) Inventors: Nan Li, Guangdong (CN); Zhijun Fan, Guangdong (CN); Chao Xu, Guangdong (CN); Lianhua Duan, Guangdong (CN); Haifeng Guo, Guangdong (CN)

(73) Assignee: SHENZHEN MICROBT ELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/795,777

(22) PCT Filed: Dec. 21, 2021

(86) PCT No.: PCT/CN2021/140016
§ 371 (c)(1),
(2) Date: Jul. 27, 2022

(87) PCT Pub. No.: WO2023/056709
PCT Pub. Date: Apr. 13, 2023

(65) Prior Publication Data
US 2024/0313753 A1    Sep. 19, 2024

(30) Foreign Application Priority Data
Oct. 9, 2021   (CN) .......................... 202111174118.2

(51) Int. Cl.
*H03K 5/14*   (2014.01)
*H03K 5/24*   (2006.01)
*H03K 19/20*  (2006.01)

(52) U.S. Cl.
CPC ............. *H03K 5/14* (2013.01); *H03K 5/2481* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 5,539,337 A | 7/1996 | Taylor et al. | |
| 6,323,688 B1 | 11/2001 | Podlesny et al. | |

(Continued)

FOREIGN PATENT DOCUMENTS

| | | | |
|---|---|---|---|
| CN | 101446843 A | 6/2009 | |
| CN | 104021246 A | 9/2014 | |

(Continued)

OTHER PUBLICATIONS

Notice of Allowance of Patent issued Aug. 16, 2023 in Korean Patent Application No. 10-2023-7015561.

(Continued)

*Primary Examiner* — Cassandra F Cox
(74) *Attorney, Agent, or Firm* — Venable LLP

(57) ABSTRACT

This disclosure relates to a pipeline clock driving circuit, a computing chip, a hashboard and a computing device. A pipeline clock driving circuit provides a pulse clock signal to a pipeline comprising multiple operation stages. The pipeline clock driving circuit includes multiple stages of clock driving circuits, each configured to provide the pulse clock signal to one corresponding operation stage; and a clock source coupled to an input of a first stage of clock driving circuit and configured to provide a basic clock signal. Inputs of other stages of clock driving circuits are coupled to outputs of previous stages of clock driving circuits. Each stage of clock driving circuit includes: a trigger; a delay module for outputting a delayed pulse signal (Continued)

to a next stage of clock driving circuit; and a combinational logic module for performing a combinational logic operation on the outputs to generate the pulse clock signal.

11 Claims, 6 Drawing Sheets

(56) References Cited

U.S. PATENT DOCUMENTS

| | | | |
|---|---|---|---|
| 10,530,375 B1 * | 1/2020 | Wang | ............... H03L 7/193 |
| 2015/0365080 A1 | 12/2015 | Kumar et al. | |

FOREIGN PATENT DOCUMENTS

| | | | |
|---|---|---|---|
| CN | 109120257 | A | 1/2019 |
| CN | 111404550 | A | 7/2020 |
| CN | 111510137 | A | 8/2020 |
| CN | 111651403 | A | 9/2020 |
| CN | 212160484 | U | 12/2020 |
| CN | 112422116 | A | 2/2021 |
| CN | 113608575 | B | 2/2022 |
| JP | 2003508840 | A | 3/2003 |
| JP | 2009157629 | A | 7/2009 |
| JP | 2011059869 | A | 3/2011 |
| JP | 2018532193 | A | 11/2018 |
| KR | 20160019335 | A | 2/2016 |
| TW | 202131632 | A | 8/2021 |
| WO | 2008023577 | A1 | 1/2010 |

OTHER PUBLICATIONS

First Office Action issued Dec. 3, 2021 in Chinese Patent Application No. 202111174118.2.
Decision to Grant issued Jan. 12, 2022 in Chinese Patent Application No. 202111174118.2.

* cited by examiner

PIPELINE CLOCK DRIVING CIRCUIT, COMPUTING CHIP, HASHBOARD AND COMPUTING DEVICE

CROSS REFERENCE TO RELATED APPLICATION

The present application is a national stage application of International Patent Application No. PCT/CN2021/140016, filed on Dec. 21, 2021, which is based on and claims priority to CN application No. 202111174118.2, filed on Oct. 9, 2021, both of which are incorporated herein by reference in their entireties.

TECHNICAL FIELD

This disclosure relates to a circuit for performing a hash algorithm. More particularly, it relates to a pipeline clock driving circuit, and a computing chip, a hashboard and a computing device comprising the pipeline clock driving circuit.

BACKGROUND

A mining machine type chip for generating cryptocurrency generally employs a pipeline structure comprising a plurality of operation stages. According to an algorithm used, operation logic is divided into several operation stages, each having a similar function design and operation structure. In particular, when latches are used as timing devices in each operation stage of the pipeline, a working clock (i.e., pulse clock) is required in the latches in each operation stage. Therefore, for each operation stage, a pulse clock is input thereto through a corresponding stage of clock driving circuit. Generally, the working clock for each operation stage is derived from the same clock source, and the clock signal generated by the clock source is transferred stage by stage through the pipeline clock driving circuit.

A basic principle of generating, for each operation stage, the working clock used for the latches is to input both an input clock signal of the present stage of clock driving circuit and a delayed input clock signal into a gate circuit (such as a NOR gate, a NAND gate, etc.) to generate the pulse clock, wherein the delayed input clock signal is generated after the input clock signal passes through a delay module. A width of the pulse clock is basically decided by a delay time of the delay module.

It should be noted that the width of the pulse clock needs to meet requirements for a minimum pulse width of the pipeline. That is, when the pulse clock is valid, it is needed that a state (high level or low level) of the input clock signal of that stage of clock driving circuit remains unchanged, so as to maintain a state of the generated pulse clock for a time equal to or longer than the minimum pulse width. Therefore, a duty cycle of the input clock signal of each stage of clock driving circuit needs to meet certain requirements.

SUMMARY

It is one of objectives of the present disclosure to provide an improved pipeline clock driving circuit.

According to an aspect of the present disclosure, there is provided a pipeline clock driving circuit configured to provide a pulse clock signal to a pipeline comprising a plurality of operation stages, the pipeline clock driving circuit comprising: a plurality of stages of clock driving circuits, each of which is configured to provide the pulse clock signal to one corresponding operation stage in the plurality of operation stages of the pipeline; and a clock source coupled to an input of a first stage of clock driving circuit and configured to provide a basic clock signal, wherein inputs of other stages of clock driving circuits in the plurality of stages of clock driving circuits than the first stage of clock driving circuit are coupled to outputs of previous stages of clock driving circuits, and wherein each stage of clock driving circuit comprises: a trigger coupled to an input of a present stage of clock driving circuit; a delay module coupled to an output of the trigger, and configured to delay a pulse signal output by the trigger, feed the delayed pulse signal back to the trigger, and output the delayed pulse signal to a next stage of clock driving circuit; and a combinational logic module coupled to outputs of the trigger and the delay module, and configured to perform a combinational logic operation on the pulse signal output by the trigger and the delayed pulse signal output by the delay module to generate the pulse clock signal to be provided to one corresponding operation stage of the pipeline.

According to another aspect of the present disclosure, there is provided a computing chip, comprising one or more pipeline clock driving circuits as described above.

According to yet another aspect of the disclosure, there is provided a hashboard, comprising one or more computing chips as described above.

According to yet another aspect of the present disclosure, there is provided a computing device, comprising one or more hashboards as described above.

Other characteristic features and advantages of the present disclosure will become clear from the following description with reference to the accompanying drawings.

BRIEF DESCRIPTION OF THE DRAWINGS

The accompanying drawings included are for illustrative purposes and are only used for providing examples of possible structures and arrangements of the inventive apparatus disclosed herein and methods of applying it to a computing device. These drawings in no way limit any change in form and detail that can be made to the embodiments by one skilled in the art without departing from the spirit and scope of the embodiments. The embodiments will be more readily understood through the following specific description in conjunction with the accompanying drawings, in which similar reference numerals designate similar structural elements.

Figure 1:
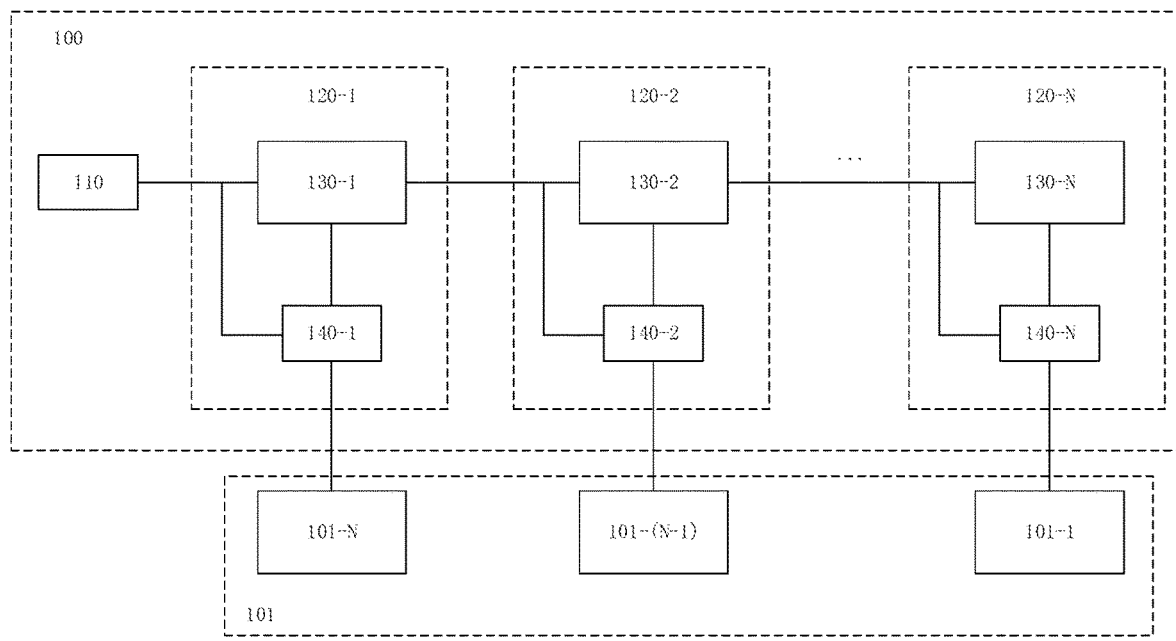
FIG. 1 shows a schematic diagram of a pipeline clock driving circuit of the related art.

Note that in the embodiments described below, one same reference numeral is sometimes shared between different drawings to denote a same portion or portions having a same function, and a repetitive description thereof will be omitted. In this specification, similar reference numerals and letters are used to designate similar items, and therefore, once a certain item is defined in one drawing, further discussion thereof is not required in subsequent drawings.

For ease of understanding, positions, sizes, ranges, and the like of structures shown in the drawings and the like do not necessarily indicate actual positions, sizes, ranges, and the like. Therefore, the disclosed invention is not limited to the positions, sizes, ranges, and the like disclosed in the drawings and the like. Furthermore, the drawings are not necessarily to scale, some features may be enlarged to show details of specific components.

DETAILED DESCRIPTION

Various exemplary embodiments of the present disclosure will now be described in detail with reference to the accompanying drawings. It should be noted that relative arrangements of components and steps, numerical expressions, and numerical values set forth in these embodiments do not limit the scope of the present disclosure unless specifically stated otherwise.

The following description of at least one exemplary embodiment is merely illustrative in nature and in no way serves as any limitation on this disclosure and its application or use. That is, a hash engine herein is shown illustratively to explain different embodiments of a circuit in the present disclosure and is not intended to be limiting. Those skilled in the art will appreciate that they are merely illustrative of exemplary ways in which the present disclosure can be implemented, rather than exhaustive ways.

Techniques, methods, and devices known to one of ordinary skill in the related art may not be discussed in detail but should be regarded as part of the granted specification where appropriate.

FIG. 1 shows a schematic diagram of a pipeline clock driving circuit 100 of the related art. The pipeline clock driving circuit 100 is configured to provide a pulse clock signal to a pipeline 101 comprising a plurality of operation stages 101-1, ..., 101-(N−1), 101-N.

As shown in FIG. 1, the pipeline clock driving circuit 100 comprises a clock source 110 and a plurality of stages of clock driving circuits 120-1, 120-2, ..., 120-N. The clock source 110 is coupled to an input of a first stage of clock driving circuit 120-1 and is configured to provide a basic clock signal. Each of the plurality of stages of clock driving circuits 120-1, 120-2, ..., 120-N is configured to provide the pulse clock signal to one corresponding operation stage in the plurality of operation stages 101-N, 101-(N−1), ..., 101-1 of the pipeline 101.

Each stage of clock driving circuit 120-1, 120-2, ..., 120-N comprises a delay module 130-1, 130-2, ..., 130-N and a combinational logic module 140-1, 140-2, ..., 140-N (e.g., NOR gate, NAND gate, etc.). The delay module 130-1, 130-2, ..., 130-N is configured to delay an input clock signal of that stage of clock driving circuit 120-1, 120-2, ..., 120-N. The combinational logic module 140-1, 140-2, ..., 140-N is configured to perform a logic operation (such as NOR, NAND, etc.) on the input clock signal of that stage of clock driving circuit 120-1, 120-2, ..., 120-N and the input clock signal delayed by the delay module 130-1, 130-2, ..., 130-N, and output the operation result thereof as the output pulse clock signal of that stage of clock driving circuit 120-1, 120-2, ..., 120-N, to be provided to one corresponding operation stage 101-N, 101-(N−1), ..., 101-1 of the pipeline 101.

Typically, a duty cycle of the basic clock signal generated by the clock source is 0.5. However, the duty cycle will be increasingly poor in a process of the stage-by-stage transfer of the clock signal through the pipeline clock driving circuit. A main reason for the poor duty cycle of the clock signal is accumulation of manufacturing errors of combinational logic devices. In the process of the stage-by-stage transfer of the clock signal through the pipeline clock driving circuit, the clock signal will pass through many combinational logic devices such as buffers, inverters and the like. Due to a manufacturing process, there are errors in performance parameters of these combinational logic devices, and such errors cause deviations in the clock duty cycle. Moreover, with the stage-by-stage transfer of the clock signal, influences caused by the parameter errors of the combinational logic devices in the stages of clock driving circuits accumulate continuously, and therefore such deviations of the clock duty cycle gradually increase. Therefore, the farther the clock driving circuit is from the clock source, the poorer the duty cycle of the input clock signal thereof, and correspondingly, the poorer the pulse clock generated by it. In this way, the requirements for the minimum pulse width of the corresponding operation stage may not be met.

That is, deviations of duty cycles of the clock signals will occur due to manufacturing errors of the combinational logic devices (e.g., buffers, inverters, etc.) in the delay modules 130-1, 130-2, ..., 130-N. In a process of transferring the basic clock signal output from the clock source 110 through the stages of the clock driving circuits 120-1, 120-2, ..., 120-N, such deviations of the duty cycle will gradually accumulate, which makes the clock pulse width of the operation stage (101-1) that is farther from the clock source 110 poorer, so that the requirement of that operation stage for the pulse width of the working clock cannot be met.

To solve this problem, the present disclosure provides an improved pipeline clock driving circuit, in which a pulse width of a pulse clock signal generated by each stage of clock driving circuit is independent of its input clock signal.

Figure 2A:
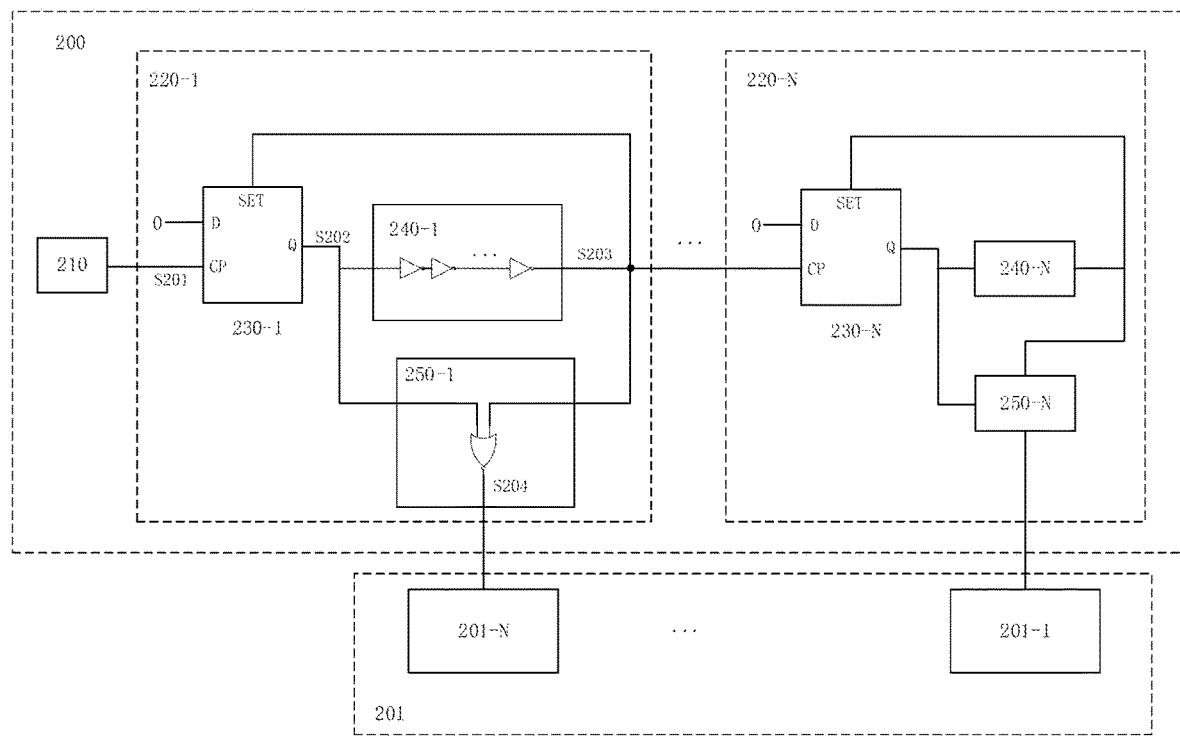
FIG. 2A shows a schematic diagram of a pipeline clock driving circuit according to some embodiments of the disclosure.
Figure 2B:
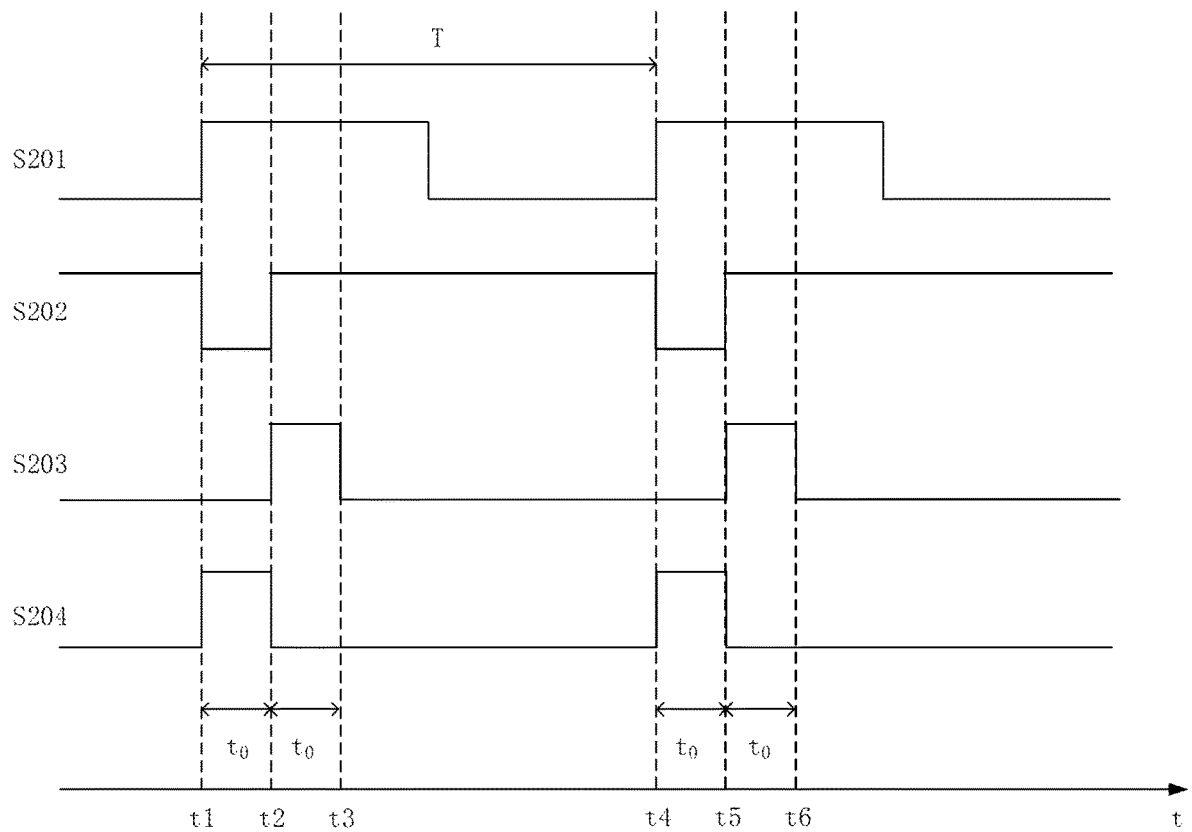
FIG. 2B shows a timing diagram of a pulse clock signal generated by a pipeline clock driving circuit according to some embodiments of the present disclosure.

FIG. 2A shows a schematic diagram of a pipeline clock driving circuit 200 according to some embodiments of the present disclosure. FIG. 2B shows a timing diagram of a pulse clock signal generated by a pipeline clock driving circuit 200 according to some embodiments of the present disclosure.

The pipeline clock driving circuit 200 is configured to provide a pulse clock signal to a pipeline 201 comprising a plurality of operation stages 201-1, ..., 201-N.

As shown in FIG. 2A, the pipeline clock driving circuit 200 comprises a clock source 210 and a plurality of stages of clock driving circuits 220-1, ..., 220-N.

The clock source 210 is coupled to an input of a first stage of clock driving circuit 220-1 and is configured to provide a basic clock signal. A duty cycle of the basic clock signal provided by the clock source 210 can be 0.5, and a frequency thereof can be several hundred megahertz, e.g. 400-700 MHz.

Inputs of other stages of clock driving circuits in the plurality of stages of clock driving circuits 220-1, ..., 220-N than the first stage of clock driving circuit 220-1 are coupled to output of previous stages of clock driving circuits, wherein each stage of clock driving circuit 220-1, ..., 220-N is configured to provide the pulse clock signal to one corresponding operation stage in the plurality of operation stages 201-N, ..., 201-1 of the pipeline 201.

Each stage of clock driving circuit 220-1, ..., 220-N comprises a trigger 230-1, ..., 230-N, a delay module 240-1, ..., 240-N, and a combinational logic module 250-1, ..., 250-N.

The trigger 230-1, ..., 230-N is coupled to an input of a present stage of clock driving circuit. That is, the trigger 230-1 in the first stage of clock driving circuit 220-1 is coupled to an output of the clock source 210, and triggers in other stages of clock driving circuits are coupled to outputs of previous stages of clock driving circuits. The trigger 230-1, ..., 230-N can be an edge trigger. A type and connection mode of the trigger 230-1, ..., 230-N can be configured as needed.

In FIG. 2A, an embodiment of the trigger 230-1, ..., 230-N as a rising edge D trigger is shown. In the embodiment shown in FIG. 2A, a SET end of the trigger 230-1, ..., 230-N is coupled to an output of the delay module 240-1, ..., 240-N, a D end is fixed to a low level (i.e., logic "0"), a CP end is coupled to an output of a previous stage of clock driving circuit, and an output end Q is coupled to the delay module 240-1, ..., 240-N as an input thereof. Under the condition that the SET end signal of the rising edge D trigger is a high level, the output end Q is always the high level. When the SET end signal is a low level, the output end Q becomes a signal value of the D end every time a rising edge of the CP end signal arrives. In other embodiments, the trigger 230-1, ..., 230-N can be, for example, a falling edge trigger, and its connection mode can be adjusted accordingly (which will be described in detail below in an embodiment shown in FIG. 3A).

The input of the delay module 240-1, ..., 240-N is coupled to the output of the trigger 230-1, ..., 230-N. The delay module 240-1, ..., 240-N is configured to delay the pulse signal output by the trigger 230-1, ..., 230-N, feed the delayed pulse signal back to the trigger 230-1, ..., 230-N and output the delayed pulse signal to a next stage of clock driving circuit. In a preferred embodiment, the delay module 240-1, ..., 240-N also inverts the pulse signal output by the trigger 230-1, ..., 230-N. The delay module 240-1, ..., 240-N can be implemented by several buffers and/or inverters. In a preferred embodiment, the delay module 240-1, ..., 240-N can be composed of an odd number of inverters, as shown in FIG. 2A. In other embodiments, the delay module 240-1, ..., 240-N can be composed of several buffers and an odd number of inverters.

The combinational logic module 250-1, ..., 250-N is coupled to outputs of the trigger 230-1, ..., 230-N and the delay module 240-1, ..., 240-N. The combinational logic module 250-1, ..., 250-N performs a combinational logic operation on the pulse signal output by the trigger 230-1, ..., 230-N and the delayed pulse signal output by the delay module 240-1, ..., 240-N to generate the pulse clock signal to be provided to one corresponding operation stage 201-N, ..., 201-1 of the pipeline 201. The combinational logic module 250-1, ..., 250-N can be designed according to the type of the trigger 230-1, ..., 230-N. In the embodiment shown in FIG. 2A, under the condition that the trigger 230-1, ..., 230-N is a rising edge D trigger, the combinational logic module 250-1, ..., 250-N can be composed of OR gates or NOR gates. In other embodiments, the combinational logic module 250-1, ..., 250-N can be composed of AND gates or NAND gates (which will be described in detail below in the embodiment shown in FIG. 3A).

In a preferred embodiment, as shown in FIG. 2A, a direction in which the pulse signal is transferred in the plurality of stages of clock driving circuits 220-1, ..., 220-N is opposite to a direction in which a data signal is transferred in the plurality of operation stages 201-1, ..., 201-N of the pipeline. That is, the first stage of clock driving circuit 220-1 is configured to provide the pulse clock signal to the last operation stage 201-N, and the last stage of clock driving circuit 220-N is configured to provide the pulse clock signal to the first operation stage 201-1, and so on. Such an arrangement can more easily meet the requirements of operation timing of the operation stages 201-1, ..., 201-N.

Referring to FIG. 2B, taking the first stage of clock driving circuit 220-1 as an example, timing of generating the pulse clock signal thereof will be described below:

The CP end of the trigger 230-1 receives the basic clock signal S201 as an input signal from the clock source 210 (accordingly, CP ends of next stages of triggers receive output signals S203 as input signals from the outputs of the delay modules in previous stages of clock driving circuits, respectively), and provides a pulse signal S202 at the output end Q to the delay module 240-1 and one input end of the combinational logic module 250-1 (which is a NOR gate in this embodiment). The delay module 240-1 inverts and delays the pulse signal S202 to obtain an output signal S203, and provides the output signal S203 to the SET end of the trigger 230-1 and the other input end of the combinational logic module 250-1, respectively, and provides the output signal S203 as an input signal of a next stage of clock driving circuit.

After the entire system is powered on, when the clock source 210 has not output the basic clock signal S201, the pulse signal S202 at the output end Q of the trigger 230-1 will stabilize at the high level. Accordingly, the output signal S203 of the delay module 240-1 stabilizes at the low level, i.e., the SET end of the trigger 230-1 is the low level, and the input signal of the next stage of clock driving circuit is also the low level (corresponding to the input signal S201 of the first stage of clock driving circuit 220-1). Therefore, the input signals of the combinational logic module 250-1 (NOR gate) are the high level (S202) and the low level (S203), respectively, and the output pulse clock signal S204 thereof is the low level.

At time t1, the clock source 210 starts outputting the basic clock signal S201. The basic clock signal S201 has a period of T.

As shown in FIG. 2B, when the signal S201 changes from the low level to the high level, the signal rising edge of the CP end of the trigger 230-1 arrives, and the SET end signal (S203) is still the low level, so that the signal S202 of the output end Q of the trigger 230-1 becomes the signal value of the D end, i.e., the low level. Accordingly, the input signals of the combinational logic module 250-1 (NOR gate) are the low level (S202) and the low level (S203), respectively, and the output pulse clock signal S204 thereof becomes the high level.

After $t_0$, at time $t_2$, the output signal S203 of the delay module 240-1 becomes the high level. $t_0$ is a delay time between the signals S203 and S202, which is determined by configuration of the delay module 240-1. In the embodiment shown in FIG. 2A, $t_0$ is a sum of delay times of the plurality of inverters in the delay module 240-1.

Accordingly, as shown in FIG. 2B, on the one hand, the SET end of the trigger 230-1 becomes the high level, so that the signal S202 at the output end Q of the trigger 230-1 becomes the high level. On the other hand, the input signals of the combinational logic module 250-1 (NOR gate) are the high level (S202) and the high level (S203), respectively, and the output pulse clock signal S204 thereof becomes the low level.

After $t_0$ again, at time $t_3$, the output signal S203 of the delay module 240-1 becomes the low level.

Accordingly, as shown in FIG. 2B, on the one hand, the SET end of the trigger 230-1 becomes the low level, but a signal rising edge has not arrived at the CP end, so that the signal S202 of the output end Q of the trigger 230-1 still remains the high level. On the other hand, the input signals of the combinational logic module 250-1 (NOR gate) are the high level (S202) and the low level (S203), respectively, and the output pulse clock signal S204 thereof is still the low level.

Thereafter, the values of the signals S202, S203, S204 remain unchanged. Until time $t_4$, a next period of the basic clock signal S201 starts. One period T of the basic clock signal S201 passes from the time t1 to the time t4.

At time t4, the signal S201 becomes the high level.

As shown in FIG. 2B, when the signal S201 changes from the low level to the high level, the signal rising edge arrives at the CP end of the trigger 230-1, and the SET end signal (S203) is still the low level, so that the signal S202 of the output end Q of the trigger 230-1 becomes the low level. Accordingly, the pulse clock signal S204 at the output end of the combinational logic module 250-1 (NOR gate) becomes the high level.

After $t_0$, at time t5, the output signal S203 of the delay module 240-1 becomes the high level.

Accordingly, as shown in FIG. 2B, on the one hand, the SET end of the trigger 230-1 becomes the high level, so that the signal S202 of the output end Q of the trigger 230-1 becomes the high level. On the other hand, the pulse clock signal S204 at the output end of the combinational logic module 250-1 becomes the low level.

After to again, at time t6, the output signal S203 of the delay module 240-1 becomes the low level.

Accordingly, as shown in FIG. 2B, the signal S202 of the output end Q of the trigger 230-1 still remains the high level, and the pulse clock signal S204 at the output end of the combinational logic module 250-1 is still the low level.

In this way, the pulse clock signal S204 with a period of T and a pulse width of to is generated at the output end of the combinational logic module 250-1. The pulse clock signal S204 is provided to the corresponding operation stage 201-N as the working clock.

In addition, the output signal S203 is generated at the output end of the delay module 240-1, and the output signal S203 is simultaneously used as the input signal of the next stage of clock driving circuit (equivalent to the input signal S201 of the first stage of clock driving circuit 220-1). The rising edge of the output signal S203 is used for triggering the trigger of the next stage of clock driving circuit. As shown in FIG. 2B, the rising edge of the output signal S203 is delayed to as compared to the rising edge of the input signal S201. Similarly, the rising edge of the output signal generated by each stage of clock driving circuit is delayed to as compared to the rising edge of the input signal of that stage of clock driving circuit, which meets the working requirements of the operation stages of the pipeline.

In this way, the pulse clock signal generated by each stage of clock driving circuit has a pulse width of to, which is decided only by the configuration of that stage of clock driving circuit and is independent of the input signal of that stage of clock driving circuit. Although manufacturing errors of the combinational logic devices in each stage of clock driving circuits may still cause the deviations in the pulse widths of the stages of input signals and output signals, the pulse width of the pulse clock signal generated by each stage of clock driving circuit is independent of the pulse width of the input signal thereof. Thus, such deviations of the pulse widths will not accumulate continuously as the signals are transferred in the stages of clock driving circuits. That is, the possible deviation of the pulse width of the pulse clock signal generated by each stage of clock driving circuit is independent of possible manufacturing errors of combinational logic devices in previous stages of clock driving circuits, and is only related to the possible manufacturing errors of the combinational logic devices in that stage of clock driving circuit. Such a manufacturing error is typically small, so that the resultant pulse width deviation is acceptable.

Figure 3A:
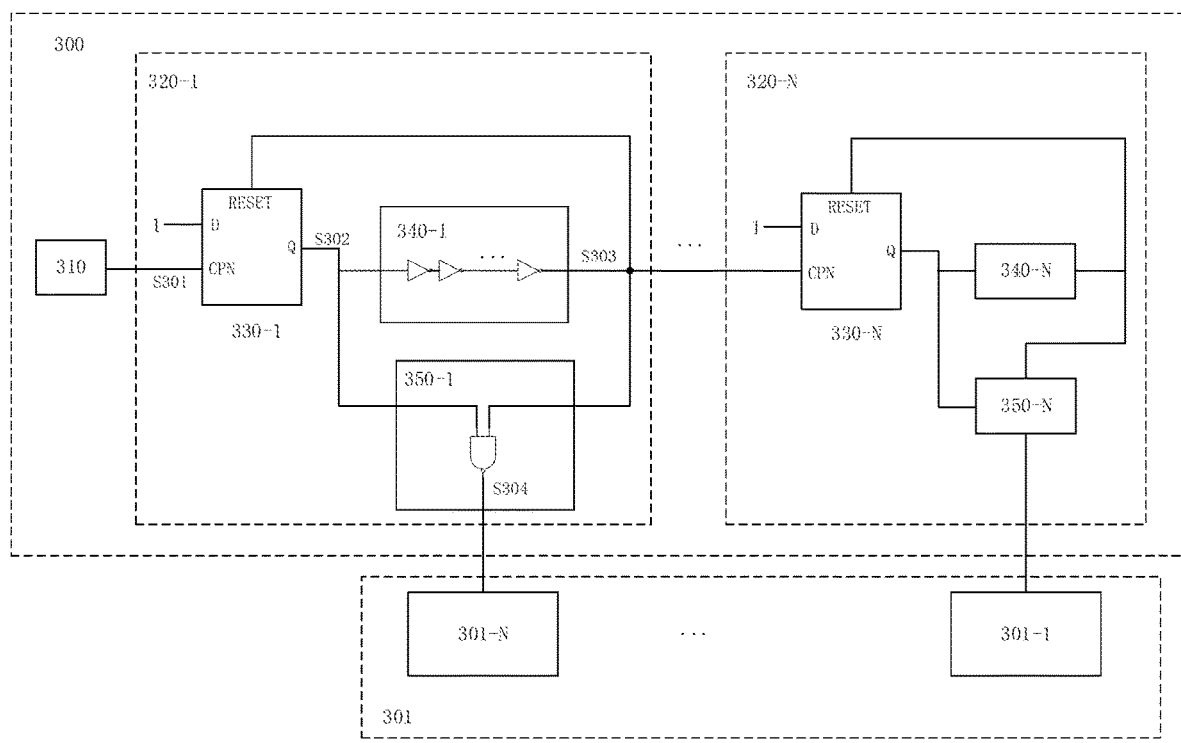
FIG. 3A shows a schematic diagram of a pipeline clock driving circuit according to other embodiments of the disclosure.
Figure 3B:
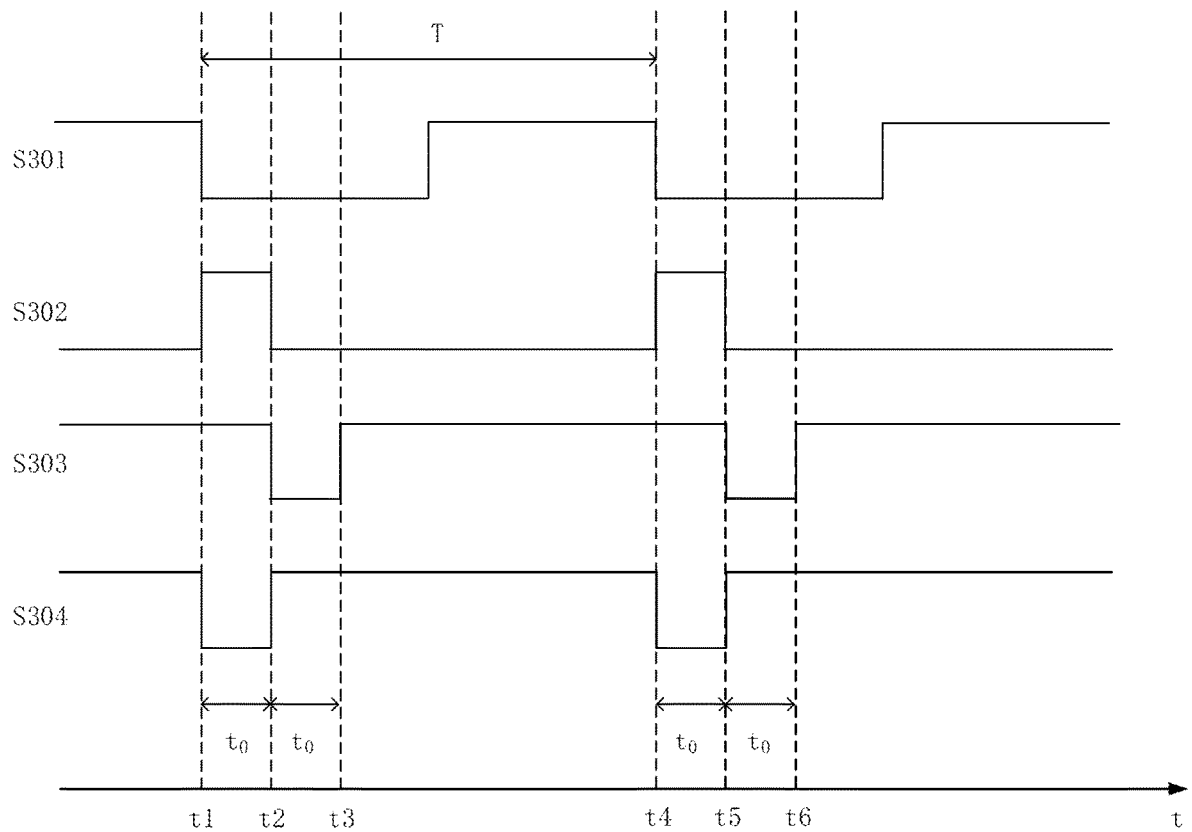
FIG. 3B shows a timing diagram of a pulse clock signal generated by a pipeline clock driving circuit according to other embodiments of the disclosure.

FIG. 3A shows a schematic diagram of a pipeline clock driving circuit 300 according to other embodiments of the present disclosure. FIG. 3B shows a timing diagram of a pulse clock signal generated by a pipeline clock driving circuit 300 according to other embodiments of the present disclosure.

The pipeline clock driving circuit 300 is configured to provide a pulse clock signal to a pipeline 301 that comprises a plurality of operation stages 301-1, . . . , 301-N. As shown in FIG. 3A, the pipeline clock driving circuit 300 comprises a clock source 310 and a plurality of stages of clock driving circuits 320-1, . . . , 320-N.

The clock source 310 is coupled to an input of a first stage of clock driving circuit 320-1 and is configured to provide a basic clock signal. Inputs of other stages of clock driving circuits in the plurality of stages of clock driving circuits 320-1, . . . , 320-N than the first stage of clock driving circuit 320-1 are coupled to outputs of previous stages of clock driving circuits, wherein each stage of clock driving circuit 320-1, . . . , 320-N is configured to provide the pulse clock signal to one corresponding operation stage in the plurality of operation stages 320-1, . . . , 320-N of the pipeline 301.

Each stage of clock driving circuit 320-1, . . . , 320-N comprises a trigger 330-1, . . . 330-N, a delay module 340-1, . . . , 340-N, and a combinational logic module 350-1, . . . , 350-N.

The trigger 330-1, . . . , 330-N is coupled to an input of a present stage of clock driving circuit. That is, the trigger 330-1 in the first stage of clock driving circuit 320-1 is coupled to an output of the clock source 310, and triggers in other stages of clock driving circuits are coupled to outputs of previous stages of clock driving circuits.

In FIG. 3A, an embodiment in which the trigger 330-1, . . . , 330-N is a falling edge D trigger is shown. In the embodiment shown in FIG. 3A, a RESET end of the trigger 330-1, . . . 330-N is coupled to an output of the delay module 340-1, . . . , 340-N, a D end is fixed to a high level (i.e., logic "1"), a CPN end is coupled to an output of a previous stage of clock driving circuit, and an output end Q is coupled to the delay module 340-1, . . . , 340-N as an input thereof. Under the condition that the RESET end signal of the falling edge D trigger is a low level, the output end Q is always the low level. Under the condition that the RESET end signal is the high level, the output end Q becomes a signal value of the D end every time a falling edge of the CPN end signal arrives.

The input of the delay module 340-1, . . . , 340-N is coupled to the output of the trigger 330-1, . . . , 330-N. The delay module 340-1, . . . , 340-N is configured to delay the pulse signal output by the trigger 330-1, . . . , 330-N, feed the delayed pulse signal back to the trigger 330-1, 330-N, and output the delayed pulse signal to a next stage of clock driving circuit. In a preferred embodiment, the delay module 340-1, . . . , 340-N also inverts the pulse signal output by the trigger 330-1, . . . 330-N. In the embodiment shown in FIG.

3A, the delay module 340-1, . . . , 340-N can be composed of an odd number of inverters.

The combinational logic module 350-1, . . . , 350-N is coupled to outputs of the trigger 330-1, . . . , 330-N and the delay module 340-1, . . . , 340-N. The combinational logic module 350-1, . . . , 350-N performs a combinational logic operation on the pulse signal output by the trigger 330-1, . . . , 330-N and the delayed pulse signal output by the delay module 340-1, . . . , 340-N to generate the pulse clock signal to be provided to one corresponding operation stage 301-N, . . . , 301-1 of the pipeline 301. In the embodiment shown in FIG. 3A, under the condition that the trigger 330-1, . . . , 330-N is the falling edge D trigger, the combinational logic module 350-1, . . . 350-N can be composed of a NAND gate.

Referring to FIG. 3B, taking the first stage of clock driving circuit 320-1 as an example, timing of generating the pulse clock signal thereof will be described below.

The CPN end of the trigger 330-1 receives the basic clock signal S301 as an input signal from the clock source 310 (accordingly, CPN ends of next stages of triggers receive output signals S303 as input signals from the outputs of the delay modules in previous stages of the clock driving circuits, respectively), and provides a pulse signal S302 at the output end Q to the delay module 340-1 and one input end of the combinational logic module 350-1 (which is a NAND gate in this embodiment). The delay module 340-1 inverts and delays the pulse signal S302 to obtain an output signal S303, and provides the output signal S303 to the RESET end of the trigger 330-1 and the other input end of the combinational logic module 350-1, respectively, and provides the output signal S303 as an input signal of a next stage of clock driving circuit.

After the entire system is powered on, when the clock source 310 has not output the basic clock signal S301, the pulse signal S302 at the output end Q of the trigger 330-1 will stabilize at the low level. Accordingly, the output signal S303 of the delay module 340-1 stabilizes at the high level, i.e., the RESET end of the trigger 330-1 is the high level, and the input signal of the next stage of clock driving circuit is also the high level (corresponding to the input signal S301 of the first stage of clock driving circuit 320-1). Therefore, the input signals of the combinational logic module 350-1 (NAND gate) are the low level (S302) and the high level (S303), respectively, and the output pulse clock signal S304 thereof is the high level.

At time t1, the clock source 310 starts outputting the basic clock signal S301. The basic clock signal S301 has a period of T.

As shown in FIG. 3B, when the signal S301 changes from the high level to the low level, a signal falling edge arrives at the CPN end of the trigger 330-1, and the RESET end signal (S303) is still the high level, so that the signal S302 of the output end Q of the trigger 330-1 becomes the signal value of the D end, i.e., the high level. Accordingly, the input signals of the combinational logic module 350-1 (NAND gate) are the high level (S302) and the high level (S303), respectively, and the output pulse clock signal S304 thereof becomes the low level.

After $t_0$, at time t2, the output signal S303 of the delay module 340-1 becomes the low level. $t_0$ is a delay time between the signals S303 and S302, which is decided by the configuration of the delay module 340-1. In the embodiment shown in FIG. 3A, to is a sum of delay times of a plurality of inverters in the delay module 340-1.

Accordingly, as shown in FIG. 3B, on the one hand, the RESET end of the trigger 330-1 becomes the low level, so that the signal S302 at the output end Q of the trigger 330-1 becomes the low level. On the other hand, the input signals of the combinational logic module 350-1 (NAND gate) are the low level (S302) and the low level (S303), respectively, and the output pulse clock signal S304 thereof becomes the high level.

After $t_0$ again, at time t3, the output signal S303 of the delay module 340-1 becomes the high level.

Accordingly, as shown in FIG. 3B, on the one hand, the RESET end of the trigger 330-1 becomes the high level, but the signal rising edge has not arrived at the CPN end, so that the signal S302 at the output end Q of the trigger 330-1 still remains the low level. On the other hand, the input signals of the combinational logic module 350-1 (NAND gate) are the low level (S302) and the high level (S303), respectively, and the output pulse clock signal S304 thereof is still the high level.

Thereafter, the values of the signals S302, S303, S304 remain unchanged. Until time t4, a next period of the basic clock signal S301 starts. One period T of the basic clock signal S301 passes from the time t1 to the time t4.

At time t4, the signal S301 becomes the low level.

As shown in FIG. 3B, when the signal S301 changes from the high level to the low level, the signal falling edge arrives at the CPN end of the trigger 330-1, so that the signal S302 of the output end Q of the trigger 330-1 becomes the high level. Accordingly, the pulse clock signal S304 at the output end of the combinational logic module 350-1 (NAND gate) becomes the low level.

After $t_0$, at time t5, the output signal S303 of the delay module 340-1 becomes the low level.

Accordingly, as shown in FIG. 3B, on the one hand, the RESET end of the trigger 330-1 becomes the low level, so that the signal S302 of the output end Q of the trigger 330-1 becomes the low level. On the other hand, the pulse clock signal S304 at the output end of the combinational logic module 350-1 becomes the high level.

After to again, at time t6, the output signal S303 of the delay module 340-1 becomes the high level.

Accordingly, as shown in FIG. 3B, the signal S302 at the output end Q of the trigger 330-1 still remains the low level, and the pulse clock signal S304 at the output end of the combinational logic module 350-1 is still high level.

In this way, the pulse clock signal S304 with a period of T and a pulse width of to is generated at the output end of the combinational logic module 350-1. The pulse clock signal S304 is provided to the corresponding operation stage 301-N as a working clock.

In addition, the output signal S303 is generated at the output end of the delay module 340-1, and the output signal S303 is simultaneously used as the input signal of the next stage of clock driving circuit (equivalent to the input signal S301 of the first stage of clock driving circuit 320-1). The falling edge of the output signal S303 is used for triggering a trigger of the next stage of clock driving circuit. As shown in FIG. 3B, the falling edge of the output signal S303 is delayed to as compared to the falling edge of the input signal S301. Similarly, the falling edge of the output signal generated by each stage of clock driving circuit is delayed to as compared to the falling edge of the input signal of that stage of clock driving circuit, which meets the working requirements of the operation stages of the pipeline.

As described above, the pulse width of the pulse clock generated by the pipeline clock driving circuit according to the present disclosure is decided by the time to delayed by the delay module. In a preferred embodiment, the delay module is composed of inverters. The greater the number of inverters is, the greater the pulse width of the generated pulse clock signal will be, and the lower the working frequency of the pipeline will be. In engineering practices, it is generally expected to make the working frequency of the pipeline as high as possible under the condition that the pulse width of the pulse clock can meet the requirements. To this end, the present disclosure provides a further improved pipeline clock driving circuit, in which the number of inverters constituting the delay module can be flexibly adjusted.

Figure 4:
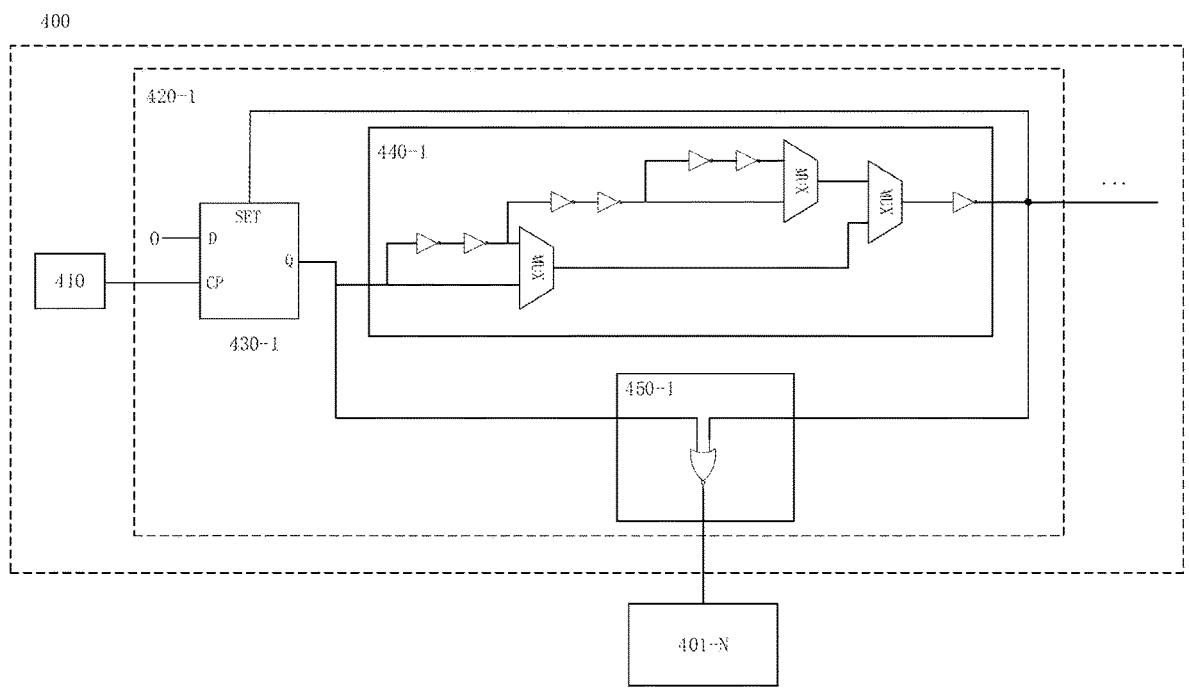
FIG. 4 shows a schematic diagram of a pipeline clock driving circuit according to further embodiments of the disclosure.

FIG. 4 shows a schematic diagram of a pipeline clock driving circuit 400 according to further embodiments of the present disclosure.

The pipeline clock driving circuit 400 is configured to provide a pulse clock signal for a pipeline. As shown in FIG. 4, the pipeline clock driving circuit 400 comprises a clock source 410 and a plurality of stages of clock driving circuits.

Taking a first stage of clock driving circuit 420-1 as an example, it is configured to provide a pulse clock signal for the last operation stage 401-N of the pipeline. The first stage of clock driving circuit 420-1 comprises a trigger 430-1, a delay module 440-1, and a combinational logic module 450-1. Configurations of the trigger 430-1, the delay module 440-1 and the combinational logic module 450-1 are similar to those of the embodiment shown in FIG. 2A, and the timing of the generated pulse clock signal thereof is similar to that shown in FIG. 2B, which are not repeated here.

Unlike the embodiment shown in FIG. 2A, the delay module 440-1 is composed of a plurality of inverters and one or more data selectors. The data selector is configured such that the plurality of inverters form a plurality of signal paths, and the number of inverters in each signal path is odd. In the embodiment shown in FIG. 4, the delay module 440-1 is composed of seven inverters and three data selectors, which form four signal paths including one, three, five, and seven inverters, respectively. Therefore, in the embodiment shown in FIG. 4, by switching states of the three data selectors, the generated clock pulse signal can be made to have four different pulse widths (i.e., corresponding to a sum of the delay times of one, three, five, and seven inverters, respectively).

Therefore, the state of the data selector can be flexibly and conveniently changed according to the actual pulse width requirements, to make the working frequency of the pipeline as high as possible, so that working efficiency of the chip is improved.

The configuration of the delay module 440-1 shown in FIG. 4 is taken as an example only. In other embodiments, the delay module 440-1 can be composed of any suitable number of inverters and data selectors in any suitable configuration to form a plurality of signal paths, such that a suitable number of inverters are included in each signal path. In a preferred embodiment, the number of inverters in each signal path is different.

The operation circuit according to the present disclosure can be implemented in various suitable manners such as software, hardware, a combination of software and hardware, and the like. In one implementation, a computing chip can comprise one or more of the pipeline clock driving circuits described above. In one implementation, a hashboard can comprise one or more computing chips. In one implementation, a computing device can comprise one or more hashboards. A plurality of hashboards can perform computing tasks in parallel.

In all examples shown and discussed herein, any specific value should be construed as exemplary only and not as a limitation. Therefore, other examples of the exemplary embodiment can have different values.

It should be further understood that terms "include/comprise", when used herein, specify the presence of stated features, entirety, steps, operations, units, and/or components, but do not preclude the presence or addition of one or more other features, entirety, steps, operations, units and/or components, and/or combinations thereof.

While some specific embodiments of the present disclosure have been shown in detail by way of examples, it should be understood by those skilled in the art that the foregoing examples are intended to be illustrative only and do not limit the scope of the present disclosure. It should be appreciated by those skilled in the art that the above embodiments can be modified without departing from the scope and spirit of the present disclosure. The scope of the disclosure is defined by the attached claims.

What is claimed is:

1. A pipeline clock driving circuit configured to provide a pulse clock signal to a pipeline comprising a plurality of operation stages, wherein the pipeline clock driving circuit comprises:
a plurality of stages of clock driving circuits, each of which is configured to provide the pulse clock signal to one corresponding operation stage in the plurality of operation stages of the pipeline; and
a clock source coupled to an input of a first stage of clock driving circuit and configured to provide a basic clock signal,
wherein inputs of other stages of clock driving circuits in the plurality of stages of clock driving circuits than the first stage of clock driving circuit are coupled to outputs of previous stages of clock driving circuits, and
wherein each stage of clock driving circuit comprises:
a trigger coupled to an input of a present stage of clock driving circuit;
a delay module coupled to an output of the trigger, and configured to delay a pulse signal output by the trigger, feed the delayed pulse signal back to the trigger, and output the delayed pulse signal to a next stage of clock driving circuit; and
a combinational logic module coupled to outputs of the trigger and the delay module, and configured to perform a combinational logic operation on the pulse signal output by the trigger and the delayed pulse signal output by the delay module to generate the pulse clock signal to be provided to one corresponding operation stage of the pipeline.

2. The pipeline clock driving circuit according to claim 1, wherein the trigger is a rising edge trigger.

3. The pipeline clock driving circuit according to claim 2, wherein the combinational logic module is an OR gate or a NOR gate.

4. The pipeline clock driving circuit according to claim 1, wherein the trigger is a falling edge trigger.

5. The pipeline clock driving circuit according to claim 4, wherein the combinational logic module is an AND gate or a NAND gate.

6. The pipeline clock driving circuit according to claim 1, wherein the delay module is composed of an odd number of inverters.

7. The pipeline clock driving circuit according to claim 1, wherein the delay module is composed of a plurality of inverters and one or more data selectors, wherein the one or more data selectors are configured such that the plurality of inverters form a plurality of signal paths and the number of inverters in each signal path is odd.

8. The pipeline clock driving circuit according to claim 7, wherein the number of inverters in each signal path is different.

9. The pipeline clock driving circuit according to claim 1, wherein a direction in which the pulse signal is transferred in the plurality of stages of clock driving circuits is opposite to a direction in which a data signal is transferred in the plurality of operation stages of the pipeline.

10. A computing chip, wherein the computing chip comprises one or more pipeline clock driving circuits according to claim 1.

11. A hashboard, wherein the hashboard comprises one or more computing chips according to claim 10.

* * * * *